US006762095B1

(12) United States Patent
Hsieh

(10) Patent No.: US 6,762,095 B1
(45) Date of Patent: Jul. 13, 2004

(54) METHOD OF FABRICATING FLASH MEMORY

(75) Inventor: Wen-Kuei Hsieh, Tainan Hsien (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/250,007

(22) Filed: May 28, 2003

(30) Foreign Application Priority Data

Feb. 19, 2003 (TW) ........................................ 92103363 A

(51) Int. Cl.[7] ............................................ H01L 21/336
(52) U.S. Cl. ........................ 438/258; 438/257; 257/314; 257/326
(58) Field of Search ................................ 438/257, 258; 257/314, 326

(56) References Cited

U.S. PATENT DOCUMENTS

| 5,188,976 A | * | 2/1993 | Kume et al. ................. 438/258 |
| 5,942,780 A | * | 8/1999 | Barsan et al. ................ 257/321 |
| 6,074,915 A | * | 6/2000 | Chen et al. ................. 438/258 |
| RE36,777 E | * | 7/2000 | Larsen et al. ................. 438/79 |
| 6,420,223 B2 | * | 7/2002 | Camerlenghi ............... 438/211 |

* cited by examiner

Primary Examiner—Amir Zarabian
Assistant Examiner—Jeff Vockrodt
(74) Attorney, Agent, or Firm—Jianq Chyun IP Office

(57) ABSTRACT

A method of fabricating flash memory is provided. A substrate divided into a memory cell region and a peripheral circuit region is provided. After forming a first conductive layer over the substrate, the first conductive layer in the memory cell region is patterned to form a first gate conductive layer. Thereafter, a gate dielectric layer is formed over the substrate and then a second conductive layer and a passivation layer are sequentially formed over the gate dielectric layer. After removing the passivation layer, the second conductive layer and the first conductive layer in the peripheral circuit region, a third conductive layer is formed over the substrate. The third conductive layer and the passivation layer in the memory cell region are removed. The second conductive layer, the gate dielectric layer and the first gate conductive layer in the memory cell region are patterned to form a plurality of memory gates. Finally, the third conductive layer in the peripheral circuit region is patterned to form a plurality of gates.

16 Claims, 5 Drawing Sheets ly damaged (for example,
METHOD OF FABRICATING FLASH MEMORY

CROSS REFERENCE TO RELATED APPLICATIONS

This application claims the priority benefit of Taiwan application Ser. No. 92103363, filed Feb. 19, 2003.

BACKGROUND OF INVENTION

1. Field of Invention

The present invention relates to a method of fabricating a semiconductor device. More particularly, the present invention relates to a method of fabricating a flash memory device.

2. Description of Related Art

Flash memory is a data storage device. Data within the flash memory can be accessed, read and erased multiple of times. Moreover, data within the device is retained even after power to the device is turned off. With these advantages, flash memory has become one of the most widely adopted non-volatile memories inside a personal computer and electronic equipment.

A typical flash memory device has a polysilicon floating gate and a polysilicon control gate above the floating gate. The control gate and the floating gate are separated from each other by a dielectric layer and the floating gate and the substrate are separated from each other by a tunneling oxide (the so-called stack gate flash memory). A positive or a negative voltage is applied to the control gate of the flash memory device to control the injection of charges into the floating gate or the discharge of charges trapped inside the floating gate.

FIGS. 1A to 1D are schematic cross-sectional views showing some of the steps for producing a conventional flash memory device. The substrate 100 in FIGS. 1A to 1D can be divided into a memory cell region 102 and a peripheral circuit region 104. As shown in FIG. 1A, a plurality of isolation structures 106 for marking out the active regions is formed in the memory cell region 102 and the peripheral circuit region 104. Thereafter, a tunneling dielectric layer 108 is formed over the substrate 100 in the memory cell region 102 and a liner layer 110 is formed over the substrate 100 in the peripheral circuit region 104. A conductive layer 112 is formed over the entire substrate 100. The conductive layer 112 over the memory cell region 102 is patterned to form a plurality of longitudinal lines 112a. A gate dielectric layer 114 is formed over the substrate. The gate dielectric layer 114 can be a composite layer such as an oxide/nitride/oxide (ONO) layer.

As shown in FIG. 1B, a patterned photoresist layer 116 is formed over the substrate 100. The patterned photoresist layer 116 covers the memory cell 102 but exposes the peripheral circuit region 104. Using the patterned photoresist layer as a mask, the gate dielectric layer 114 and the conductive layer 112 above the peripheral circuit region 104 is removed. Thereafter, a gate dielectric layer 118 and another gate dielectric layer 120 having a thickness greater than the gate dielectric layer 118 is formed over the peripheral circuit region 104.

As shown in FIG. 1C, the patterned photoresist layer 116 is removed and then another conductive layer 122 is formed over the entire substrate 100.

As shown in FIG. 1D, the conductive layer 122 is patterned to form a control gate conductive layer 124 in the memory cell region 102. The gate dielectric layer 114, the conductive layer 112a and the tunneling dielectric layer 108 are patterned to form a stacked gate structure 126. Meanwhile, the conductive layer 122 on the patterned peripheral circuit region 104 to form a gate structure 128.

In the aforementioned fabrication process, the gate dielectric layer 114 is a very thin and fragile film. Consequently, the gate dielectric layer 114 is easily damaged (for example, in the ashing process of the patterned photoresist layer 116 or cleaning process). Any deviation in the properties of the gate dielectric layer 114 is likely to bring about some deterioration in the data retaining capacity of the flash memory.

SUMMARY OF INVENTION

Accordingly, one object of the present invention is to provide a method of fabricating a flash memory device capable of reducing in-process damage to the gate dielectric layer within the flash memory and hence boosting overall device performance.

To achieve these and other advantages and in accordance with the purpose of the invention, as embodied and broadly described herein, the invention provides a method of fabricating flash memory. A substrate divided into a memory cell region and a peripheral circuit region is provided. A first conductive layer is formed over the substrate and then the first conductive layer in the memory cell region is patterned to form a first gate conductive layer. Thereafter, a gate dielectric layer is formed over the substrate. A second conductive layer and a passivation layer are sequentially formed over the gate dielectric layer. The passivation layer, the second conductive layer and the first conductive layer in the peripheral circuit region are removed and then a third conductive layer is formed over the substrate. The third conductive layer and the passivation layer in the memory cell region are removed. After that, the second conductive layer, the gate dielectric layer and the first gate conductive layer in the memory cell region is patterned to form a plurality of memory gates. Finally, the third conductive layer in the peripheral circuit region is patterned to form a plurality of gates.

In this invention, after removing the passivation layer, the second conductive layer and the first conductive layer in the peripheral circuit region but before forming the third conductive layer over the substrate, further includes a plurality of oxide layers each having a different thickness in the peripheral circuit region.

After removing the passivation layer, the second conductive layer and the first conductive layer in the peripheral circuit region but before forming the third conductive layer over the substrate, this invention may further include forming at least one first gate dielectric layer and a second gate dielectric layer in the peripheral circuit region. The step of forming the first gate dielectric layer and the second gate dielectric layer in the peripheral circuit region is conducted before forming the patterned photoresist layer in the peripheral circuit region. The patterned photoresist layer exposes the region for forming the first gate dielectric layer. Thereafter, an implant is carried out implanting dopants into the region for forming the first gate dielectric layer. After removing the patterned photoresist layer, a thermal oxidation is carried out to form the first gate dielectric layer and the second gate dielectric layer in the peripheral circuit region.

In this invention, a conductive layer and a passivation layer are sequentially formed over the gate dielectric layer in the memory cell region after forming the gate dielectric layer. Hence, the gate dielectric layer is protected against any harmful in-process damages so that properties of the gate dielectric layer can be maintained.

Furthermore, the stack gate structure in the memory cell region and the gate structure in the peripheral circuit region have different thickness. Hence, coupling capacitance between the word lines and the bit lines can be optimized.

In addition, the control gate conductive layer in the memory cell region has a thickness greater than the gate structure in the peripheral circuit region. Thus, in the process of patterning the second conductive layer to form the control gate conductive layer and the subsequent patterning of the gate dielectric layer, the first conductive layer, the tunneling dielectric layer to form the stack gate structure, the third conductive layer in the peripheral circuit region is also concurrently patterned to form the gate structure. This simplifies the overall processing steps considerably.

This invention also provides an alternative method of fabricating flash memory. A substrate divided into a memory cell region and a peripheral circuit region is provided. A first conductive layer is formed over the substrate. The first conductive layer in the memory cell region is patterned to form a first gate conductive layer. Thereafter, a gate dielectric layer is formed over the substrate. A second conductive layer is formed over the gate dielectric layer. After removing the second conductive layer and the first conductive layer in the peripheral circuit region, a third conductive layer is formed over the substrate. The second conductive layer, the gate dielectric layer and the first gate conductive layer in the memory cell region is patterned to form a plurality of memory gates. The third conductive layer in the peripheral circuit region is patterned to form a plurality of gates.

In this invention, after removing the second conductive layer and the first conductive layer in the peripheral circuit region but before forming the third conductive layer over the substrate, further includes forming a plurality of oxide layers each having a different thickness over the peripheral circuit region.

After removing the passivation layer, the second conductive layer and the first conductive layer in the peripheral circuit region but before forming the third conductive layer over the substrate, this invention may further include forming at least one first gate dielectric layer and a second gate dielectric layer in the peripheral circuit region. The step of forming the first gate dielectric layer and the second gate dielectric layer in the peripheral circuit region is conducted before forming the patterned photoresist layer in the peripheral circuit region. The patterned photoresist layer exposes the region for forming the first gate dielectric layer. Thereafter, an implant is carried out implanting dopants into the region for forming the first gate dielectric layer. After removing the patterned photoresist layer, a thermal oxidation is carried out to form the first gate dielectric layer and the second gate dielectric layer in the peripheral circuit region.

In this invention, a conductive layer is formed over the gate dielectric layer in the memory cell region after forming the gate dielectric layer. Hence, the gate dielectric layer is protected against any harmful in-process damages so that properties of the gate dielectric layer can be maintained.

Furthermore, the stack gate structure in the memory cell region and the gate structure in the peripheral circuit region have different thickness. Hence, coupling capacitance between the word lines and the bit lines can be optimized.

In addition, the control gate conductive layer in the memory cell region has a thickness greater than the gate structure in the peripheral circuit region. Thus, in the process of patterning the second conductive layer to form the control gate conductive layer and the subsequent patterning of the gate dielectric layer, the first conductive layer, the tunneling dielectric layer to form the stack gate structure, the third conductive layer in the peripheral circuit region is also concurrently patterned to form the gate structure. This simplifies the overall processing steps considerably.

This invention also permits the absence of the passivation layer so that the second conductive layer directly serves as a protective layer for the gate dielectric layer. This simplified the fabrication process of the flash memory even more.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
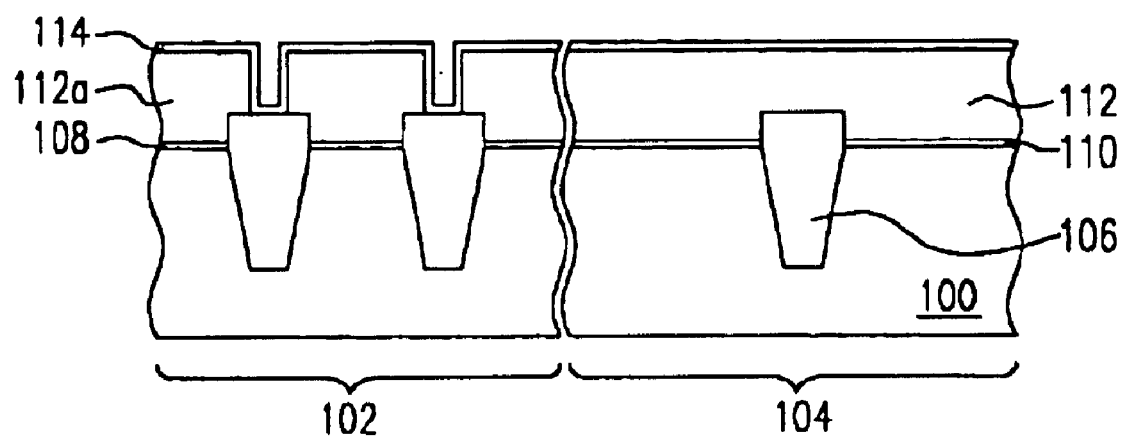
FIGS. 1A to 1D are schematic cross-sectional views showing some of the steps for producing a conventional flash memory device.
Figure 1B:
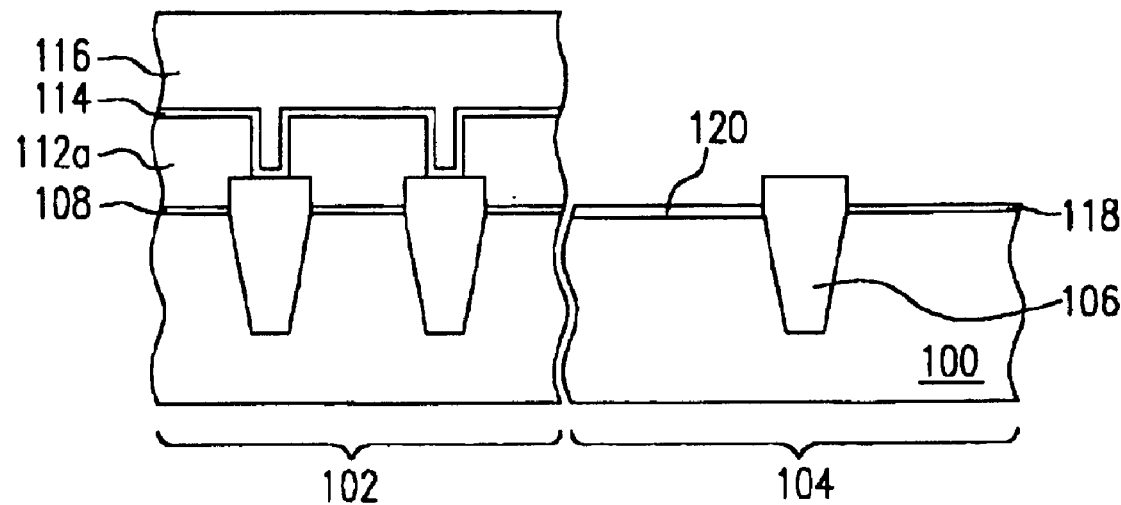
Figure 1C:
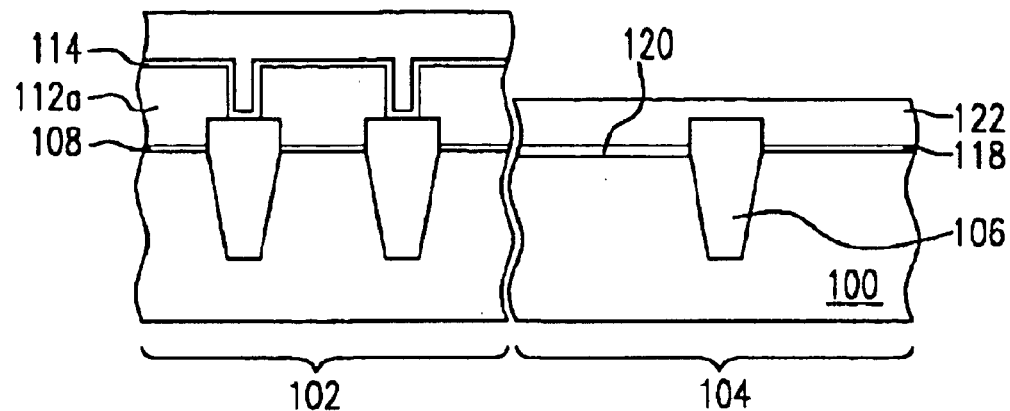
Figure 1D:
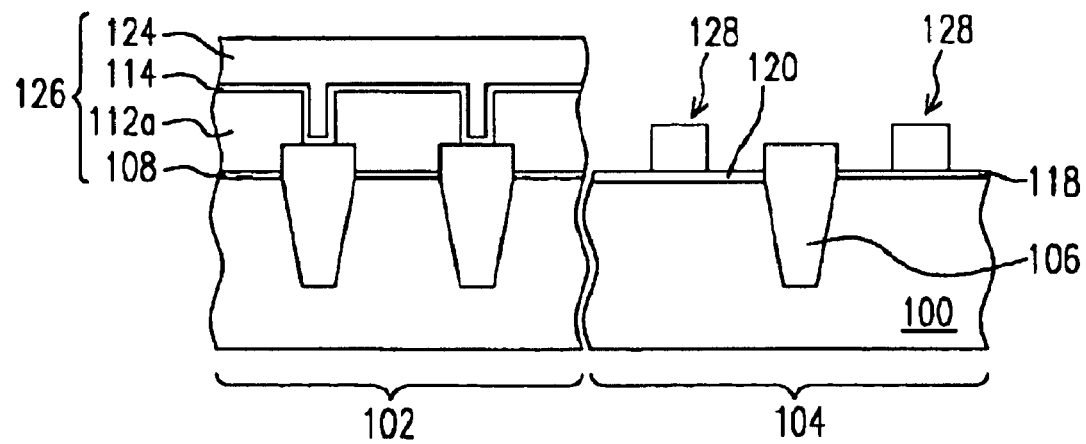

Reference will now be made in detail to the present preferred embodiments of the invention, examples of which are illustrated in the accompanying drawings. Wherever possible, the same reference numbers are used in the drawings and the description to refer to the same or like parts.

Figure 2A:
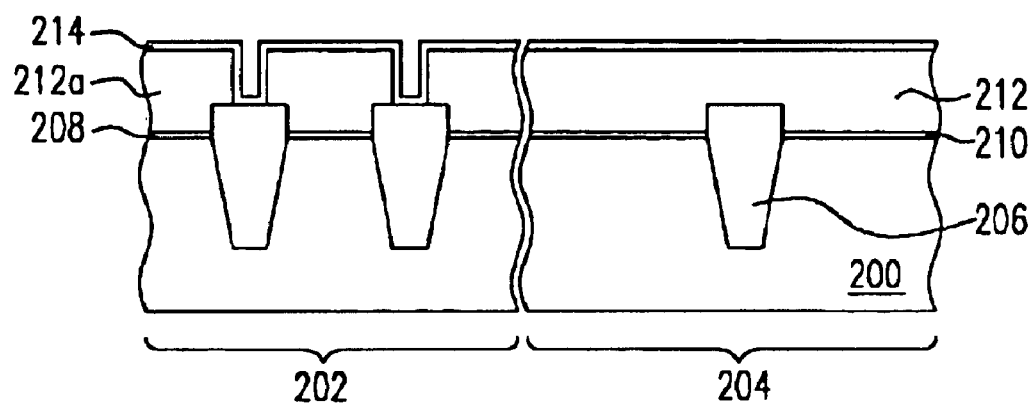
FIGS. 2A to 2F are schematic cross-sectional views showing the progression of steps for producing a flash memory device according to one preferred embodiment of this invention.

FIGS. 2A to 2F are schematic cross-sectional views showing the progression of steps for producing a flash memory device according to one preferred embodiment of this invention. As shown in FIG. 2A, a substrate 200 divided into a memory region 202 and a peripheral circuit region 204 is provided. A plurality of isolation structures 206 for marking out the active regions is formed in the memory cell region 202 and the peripheral circuit region 204. The isolation structures 206 are formed, for example, by performing a local oxidation of silicon (LOCOS) or conducting a shallow trench isolation (STI) process. A tunneling dielectric layer 208 is formed over the substrate 200 in the memory cell region 202 and a liner layer 210 is formed over the substrate 200 in the peripheral circuit region 204. The tunneling oxide layer 208 and the liner layer 210 is fabricated using a material such as silicon oxide in a thermal oxidation.

Thereafter, a conductive layer 212 is formed over the entire substrate 200. The conductive layer 212 is a doped polysilicon formed, for example, by depositing undoped polysilicon over the substrate 200 in a chemical vapor deposition and then implanting ions to form the doped polysilicon layer. The conductive layer 212 in the memory cell region 202 is patterned to form a plurality of longitudinal conductive lines 212a (gate conductive layers). A gate dielectric layer 214 is formed over the substrate 200. The gate dielectric layer 214 is a composite layer such as an oxide/nitride/oxide (ONO) layer. The gate dielectric layer 214 is formed, for example, by performing a thermal oxidation to form a silicon oxide layer and then carrying out a chemical vapor deposition to form a silicon nitride layer and another silicon oxide layer thereon.

Figure 2B:
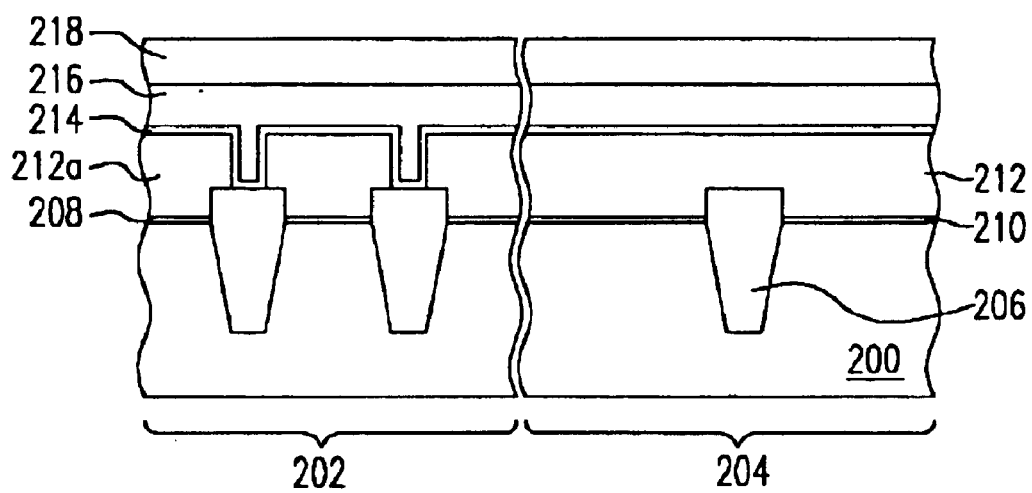

As shown in FIG. 2B, a conductive layer 216 is formed over the substrate 200. The conductive layer 216 is a doped polysilicon formed, for example, by depositing undoped polysilicon in a chemical vapor deposition and then implanting ions to form the doped polysilicon layer. A passivation layer 218 is formed over the substrate 200. The passivation layer 218 is a silicon nitride layer formed, for example, by performing a chemical vapor deposition. Obviously, the passivation layer 218 can be fabricated using some other materials having an etching selectivity that differs from the conductive layer 216 including silicon oxide or silicon oxy-nitride.

Figure 2C:
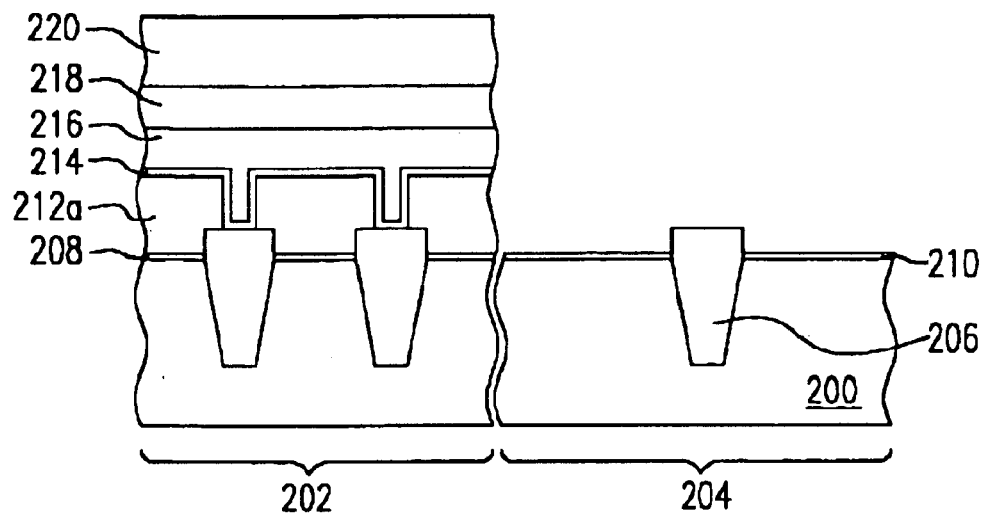

As shown in FIG. 2C, a patterned photoresist layer 220 is formed over the substrate 200. The patterned photoresist layer 220 covers the memory cell region 202 but exposes the peripheral circuit region 204. Thereafter, using the patterned photoresist layer 220 as a mask, the passivation layer 218, the conductive layer 216, the gate dielectric layer 214 and the conductive layer 212 in the peripheral circuit region 204 is removed.

Figure 2D:
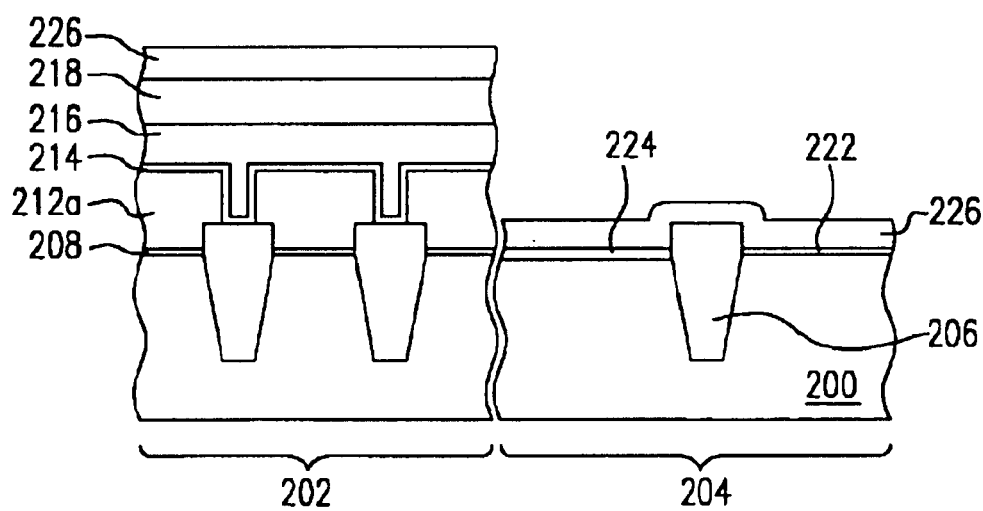

As shown in FIG. 2D, the patterned photoresist layer 220 is removed. Thereafter, a gate dielectric layer 222 and another gate dielectric layer 224 having a thickness greater than the gate dielectric layer 222 are formed in the peripheral circuit region 204. The gate dielectric layer 222 and the gate dielectric layer 224 are formed, for example, by forming a mask layer (not shown) that exposes the region for forming the gate dielectric layer 224 over the substrate 200 and then implanting dopants into the region. After removing the mask layer and the liner layer 210, a thermal oxidation is carried out to form the gate dielectric layers 222 and 224 each having a different thickness. A conductive layer 226 such as a doped polysilicon layer is formed over the substrate 200. The conductive layer 226 is formed, for example, by depositing undoped polysilicon in a chemical vapor deposition and then implanting ions to form the doped polysilicon.

Figure 2E:
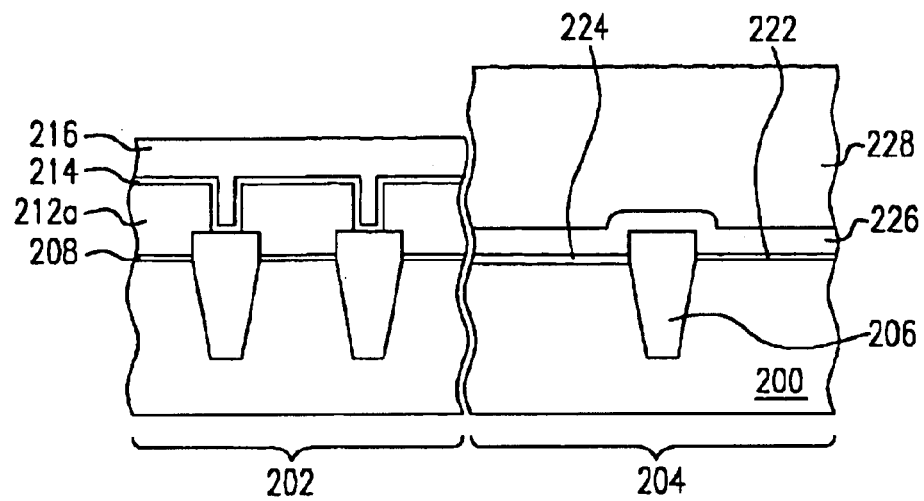

As shown in FIG. 2E, a patterned photoresist layer 228 is formed over the substrate 200. The patterned photoresist layer 228 covers the peripheral circuit region 204. Using the patterned photoresist layer 228 as a mask, the conductive layer 226 in the memory cell region 202 is removed. Thereafter, again using the patterned photoresist layer 228 as a mask, the passivation layer 218 is removed.

Figure 2F:
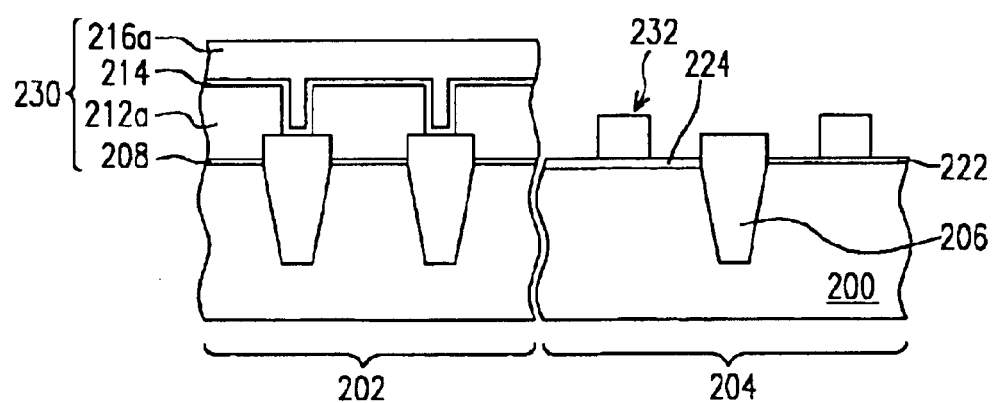

As shown in FIG. 2F, the patterned photoresist layer 228 is removed and then the conductive layer 216 is patterned to form a control gate conductive layer 216a. Next, the gate dielectric layer 214, the conductive layer 212a and the tunnel dielectric layer 208 are patterned to form a stack gate structure 230. At the same time, the conductive layer 226 in the peripheral circuit region 204 is patterned to form a gate structure 232. Thereafter, other necessary steps for fabricating a complete flash memory are carried out. Since these steps should be familiar, detailed description is omitted.

According to the embodiment of this invention, the conductive layer 216 and the passivation layer 218 over the gate dielectric layer 214 in the memory region 202 is able to protect the gate dielectric layer 214 against unwanted in-process damages. Thus, electrical properties of the gate dielectric layer 214 can be maintained.

Furthermore, the stack gate structure in the memory cell region and the gate structure in the peripheral circuit region have different thickness. This optimizes the coupling capacitance between the word line and the bit line.

In addition, thickness of the control gate conductive layer in the memory cell region is greater than the gate structure in the peripheral circuit region. Therefore, the process of patterning the conductive layer 216 into the control gate conductive layer 216a and the subsequent patterning the gate dielectric layer 214, the conductive layer 212a and the tunneling dielectric layer 208 to form the stack gate structure 230 can be carried out in tandem with the process of patterning the conductive layer 226 in the peripheral circuit region 204 to form the gate structure 232.

In the aforementioned embodiment, a conductive layer and a passivation layer are formed over the gate dielectric layer. Obviously, this invention also permits the absence of the passivation layer such that the conductive layer alone serves as a protective layer for protecting the gate dielectric layer. In other words, the fabrication process is further simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating flash memory, comprising the steps of:

providing a substrate divided into a memory cell region and a peripheral circuit region;

forming a first conductive layer over the substrate;

patterning the first conductive layer in the memory cell region to form a first gate conductive layer;

forming a gate dielectric layer over the substrate;

forming a second conductive layer over the gate dielectric layer;

forming a passivation layer over the second conductive layer;

removing the passivation layer, the second conductive layer and the first conductive layer in the peripheral circuit region;

forming a third conductive layer over the substrate;

removing the third conductive layer and the passivation layer in the memory cell region; and patterning the second conductive layer, the gate dielectric layer and the first gate conductive layer in the memory cell region to form a plurality of memory gates and patterning the third conductive layer in the peripheral circuit region to form a plurality of gates, wherein the second conductive layer, the gate dielectric layer and the first gate conductive layer in the memory cell region, and the third conductive layer in the peripheral circuit region are patterned at the same time.

2. The method of claim 1, wherein the gate dielectric layer includes a composite layer such as an oxide/nitride/oxide layer.

3. The method of claim 1, wherein material constituting the first gate conductive layer includes polysilicon.

4. The method of claim 1, wherein after removing the passivation layer, the second conductive layer and the first conductive layer in the peripheral circuit region but before forming the third conductive layer over the substrate, further includes forming at least one first gate dielectric layer and a second gate dielectric layer in the peripheral circuit region.

5. The method of claim 4, wherein the step of forming at least one first gate dielectric layer and a second gate dielectric layer in the peripheral circuit region includes the sub-steps of:

forming a patterned photoresist layer in the peripheral circuit region, wherein the patterned photoresist layer exposes an area for forming the first gate dielectric layer;

implanting dopants into the area for forming the first gate dielectric layer;

removing the patterned photoresist layer; and conducting a thermal oxidation to form the first gate dielectric layer and the second gate dielectric layer in the peripheral circuit region.

6. The method of claim 1, wherein after removing the passivation layer, the second conductive layer and the first conductive layer in the peripheral circuit region but before forming the third conductive layer over the substrate, further includes forming a plurality of oxide layers each having a different thickness inside the peripheral circuit region.

7. The method of claim 1, wherein material constituting the passivation layer includes silicon nitride.

8. The method of claim 1, wherein material constituting the passivation layer includes silicon oxide.

9. The method of claim 1, wherein material constituting the passivation layer includes silicon oxy-nitride.

10. A method of fabricating flash memory, comprising the steps of:

providing a substrate divided into a memory cell region and a peripheral circuit region;

forming a first conductive layer over the substrate;

patterning the first conductive layer in the memory cell region to form a first gate conductive layer;

forming a gate dielectric layer over the substrate;

forming a second conductive layer over the gate dielectric layer;

removing the second conductive layer and the first conductive layer in the peripheral circuit region;

forming a third conductive layer over the substrate; and patterning the third conductive layer, the second conductive layer, the gate dielectric layer and the first gate conductive layer in the memory cell region to form a plurality of memory gates and patterning the third conductive layer in the peripheral circuit region to form a plurality of gates, wherein the third conductive layer, the second conductive layer, the gate dielectric layer and the first gate conductive layer in the memory cell region, and the third conductive layer in the peripheral circuit region are patterned at the same time.

11. The method of claim 10, wherein the gate dielectric layer includes a composite layer such as an oxide/nitride/oxide layer.

12. The method of claim 10, wherein material constituting the first gate conductive layer includes polysilicon.

13. The method of claim 10, wherein the first conductive layer, the second conductive layer and the third conductive layer are fabricated using polysilicon.

14. The method of claim 10, wherein after removing the second conductive layer and the first conductive layer in the peripheral circuit region but before forming the third conductive layer over the substrate, further includes forming at least one first gate dielectric layer and a second gate dielectric layer in the peripheral circuit region.

15. The method of claim 14, wherein the step of forming at least one first gate dielectric layer and a second gate dielectric layer in the peripheral circuit region includes the sub-steps of:

forming a patterned photoresist layer in the peripheral circuit region, wherein the patterned photoresist layer exposes an area for forming the first gate dielectric layer;

implanting dopants into the area for forming the first gate dielectric layer;

removing the patterned photoresist layer; and conducting a thermal oxidation to form the first gate dielectric layer and the second gate dielectric layer in the peripheral circuit region.

16. The method of claim 10, wherein after removing the second conductive layer and the first conductive layer in the peripheral circuit region but before forming the third conductive layer over the substrate, further includes forming a plurality of oxide layers each having a different thickness inside the peripheral circuit region.

* * * * *